US008634191B2

(12) United States Patent
Tang et al.

(10) Patent No.: US 8,634,191 B2
(45) Date of Patent: Jan. 21, 2014

(54) PORTABLE ELECTRONIC DEVICE WITH BUFFERED INTERNAL ELECTRONIC MODULE

(75) Inventors: Xue-Dong Tang, Shenzhen (CN); Ke-Hui Peng, Shenzhen (CN); Ren-Wen Wang, Shenzhen (CN); Chin-Sung Yang, New Taipei (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 230 days.

(21) Appl. No.: 13/241,269

(22) Filed: Sep. 23, 2011

(65) Prior Publication Data

US 2012/0327571 A1 Dec. 27, 2012

(30) Foreign Application Priority Data

Jun. 21, 2011 (CN) .......................... 2011 1 0167263

(51) Int. Cl.
*G06F 1/16* (2006.01)
*H05K 5/00* (2006.01)
*H05K 7/00* (2006.01)
*H05K 7/14* (2006.01)

(52) U.S. Cl.
USPC ................. 361/679.57; 361/747; 361/679.41; 361/679.01; 361/679.02; 361/679.55; 174/544

(58) Field of Classification Search
USPC ............ 361/679.01, 679.02, 679.55, 679.56, 361/679.57, 679.58, 726, 732, 740, 742, 361/747, 752, 753, 758, 759, 803, 804, 361/679.41; 455/575.1, 575.2, 575.3, 455/575.4, 575.8; 174/544
See application file for complete search history.

(56) References Cited

U.S. PATENT DOCUMENTS

2010/0008027 A1* 1/2010 Yao et al. ................. 361/679.01
2010/0254078 A1* 10/2010 Zheng et al. ............. 361/679.02
2011/0182004 A1* 7/2011 Shen ........................ 361/679.01

* cited by examiner

*Primary Examiner* — Hoa C Nguyen
*Assistant Examiner* — Binh Tran
(74) *Attorney, Agent, or Firm* — Altis Law Group, Inc.

(57) ABSTRACT

An exemplary portable electronic device includes a bottom cover, a top cover, an electronic module, and elastic washers. The top cover engages with the bottom cover to define a space therebetween. The electronic module is received in the space. Poles protrude up from the bottom cover. The elastic washers are fixed on the electronic module. A through hole is defined in each of the washers. The poles respectively extend through the through holes of the washers, and opposite ends of each of the washers respectively elastically abut the top cover and the bottom cover.

20 Claims, 7 Drawing Sheets

PORTABLE ELECTRONIC DEVICE WITH BUFFERED INTERNAL ELECTRONIC MODULE

BACKGROUND

1. Technical Field

The present disclosure relates to electronic devices, and particularly to a portable electronic device configured to withstand vibration caused by external factors.

2. Description of Related Art

Generally, a portable electronic device includes a shell housing a plurality of electronic components therein. The electronic components are precision pieces, and are prone to be damaged or destroyed by vibration when the portable electronic device is subjected to external impact, jarring, shock etc. Thus, the electronic components of the portable electronic device are at risk if the portable electronic device is accidentally bumped or dropped or misused, and the stability and reliable performance of the portable electronic device are liable to be impaired.

What is needed, therefore, is a portable electronic device which can overcome the described limitations.

DETAILED DESCRIPTION

Figure 1:
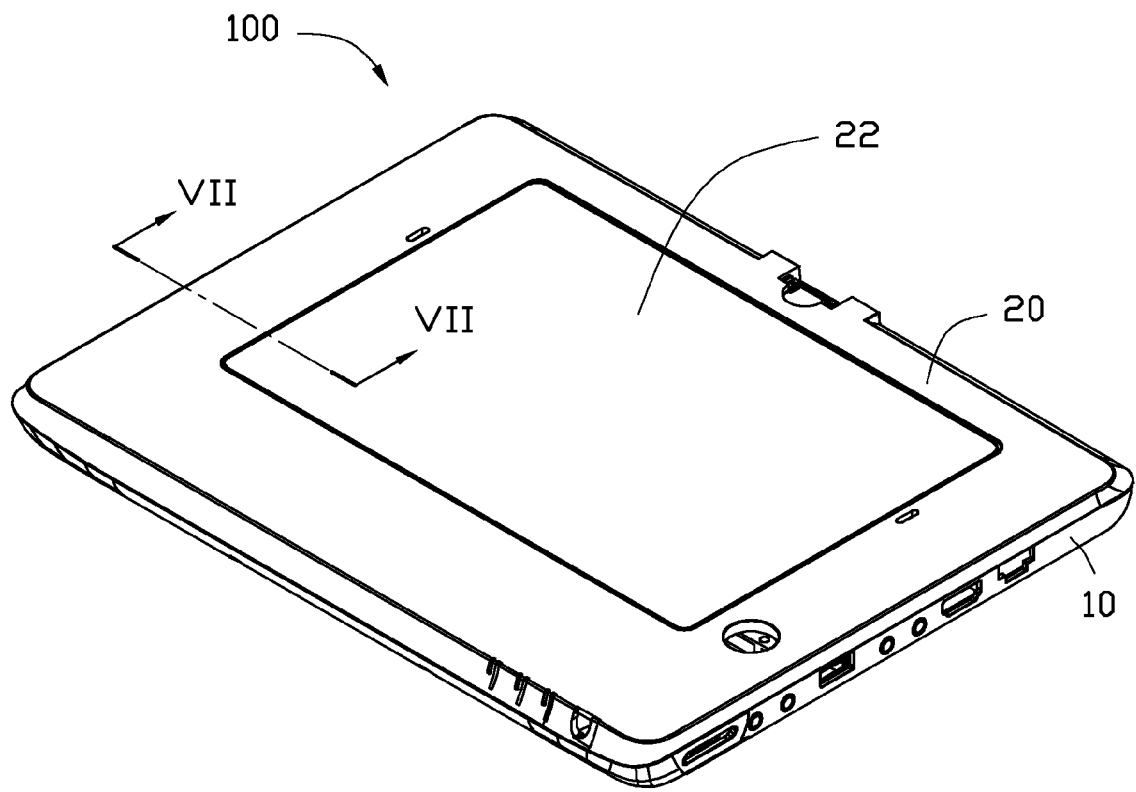
FIG. 1 is an assembled, isometric view of a portable electronic device according to an embodiment of the present disclosure.
Figure 2:
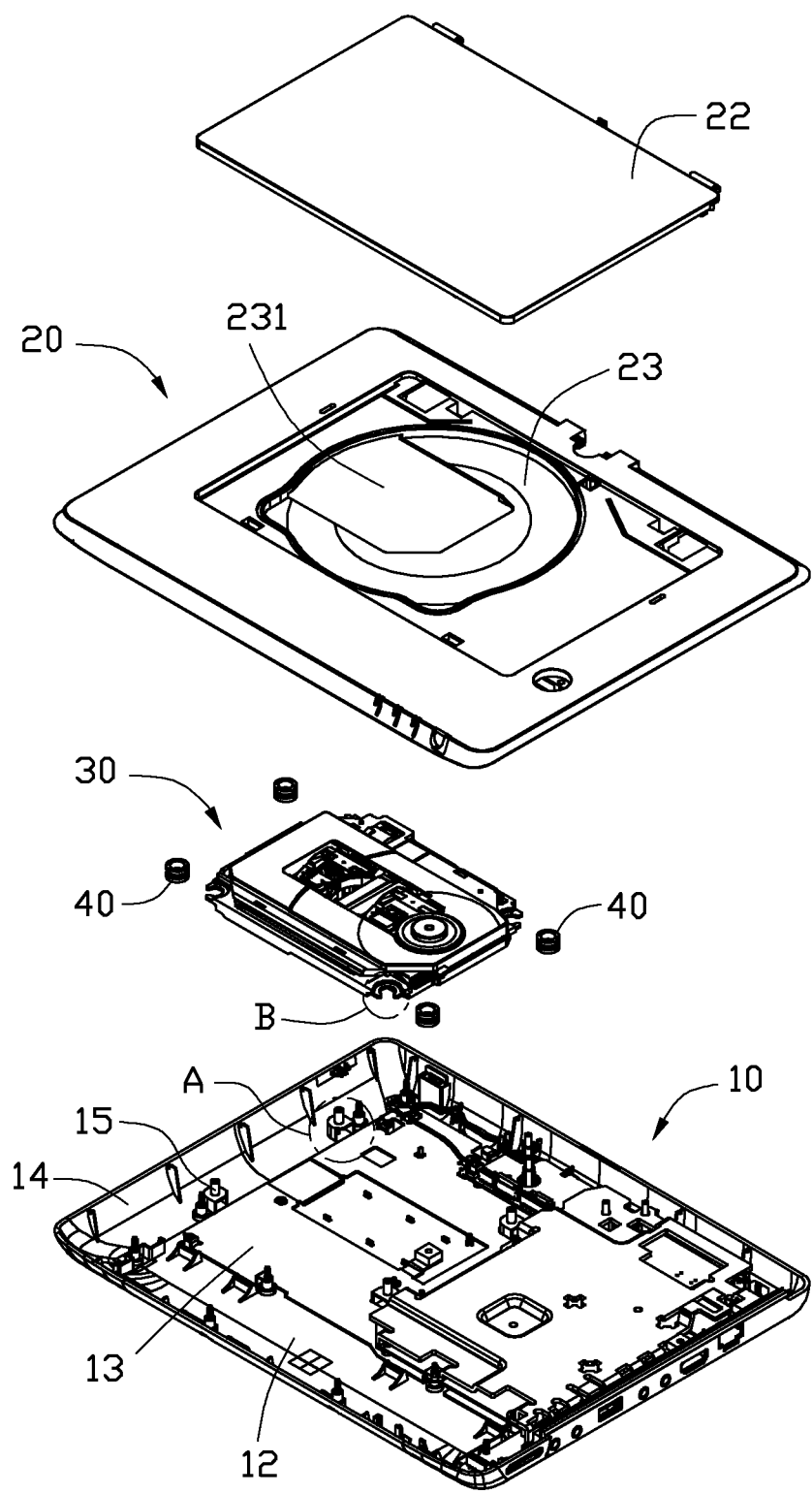
FIG. 2 is an exploded view of the portable electronic device of FIG. 1.

Referring to FIGS. 1-2, a portable electronic device 100 is shown. The portable electronic device 100 includes a top cover 20, a bottom cover 10, an electronic module 30, and a plurality of washers 40. The top cover 20 engages with the bottom cover 10 to define a receiving chamber 25 therebetween (shown in FIG. 7). The electronic module 30 and the washers 40 are received in the receiving chamber 25. In this embodiment, the portable electronic device 100 is a DVD (Digital Video Disc) player, and the electronic module 30 is a DVD driver.

The bottom cover 10 includes a substantially rectangular bottom plate 12, and four sidewalls 14 extending up from four edges of the bottom plate 12 to the top cover 20. A printed circuit board 13 is arranged on the bottom plate 12. A plurality of poles 15 extends up away from the bottom plate 12 and engages with the washers 40. The number of poles 15 is equal to the number of washers 40. In this embodiment, there are four poles 15 and four washers 40. The poles 15 are located at four corners of the electronic module 30.

Figure 4:
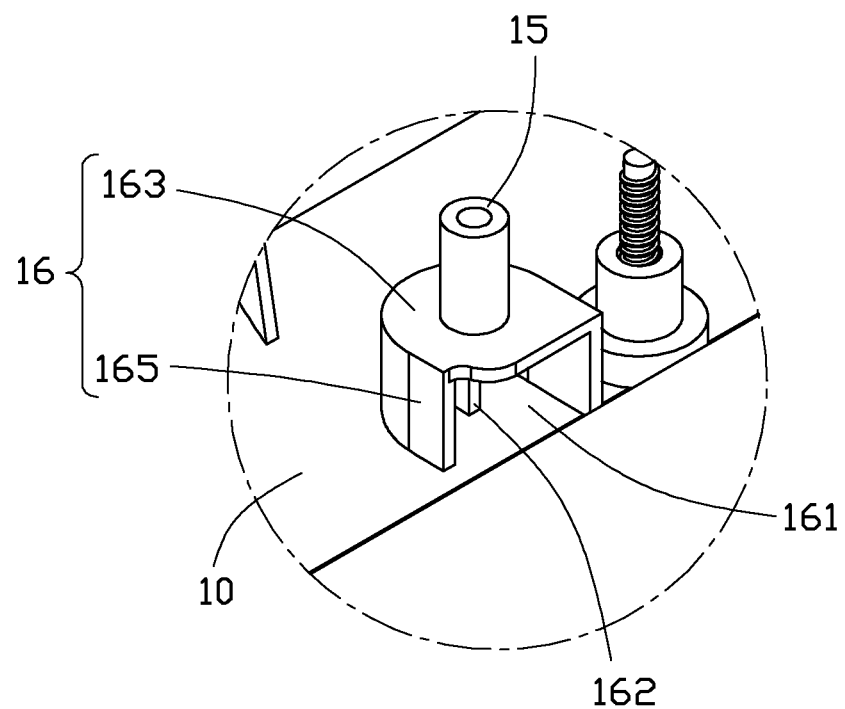
FIG. 4 is an enlarged view of a circled part A of FIG. 2.

Referring also to FIG. 4, each of the poles 15 is a hollow cylinder. A plurality of supporting members 16 is formed on the bottom plate 12. The poles 15 are respectively formed on the supporting members 16. Each of the supporting members 16 is generally a hollow cube, and includes a top plate 163 and a peripheral sidewall 165 interconnecting the top plate 163 and the bottom plate 12. A cutout 161 is defined at a lateral side of the sidewall 165. A rib 162 is formed in the supporting member 16. Opposite ends of the rib 162 connect with the bottom plate 12 and the top plate 163 of the supporting member 16 to enhance the strength and stability of the supporting member 16. The pole 15 is formed on a middle of the top plate 163 of the supporting member 16.

Figure 3:
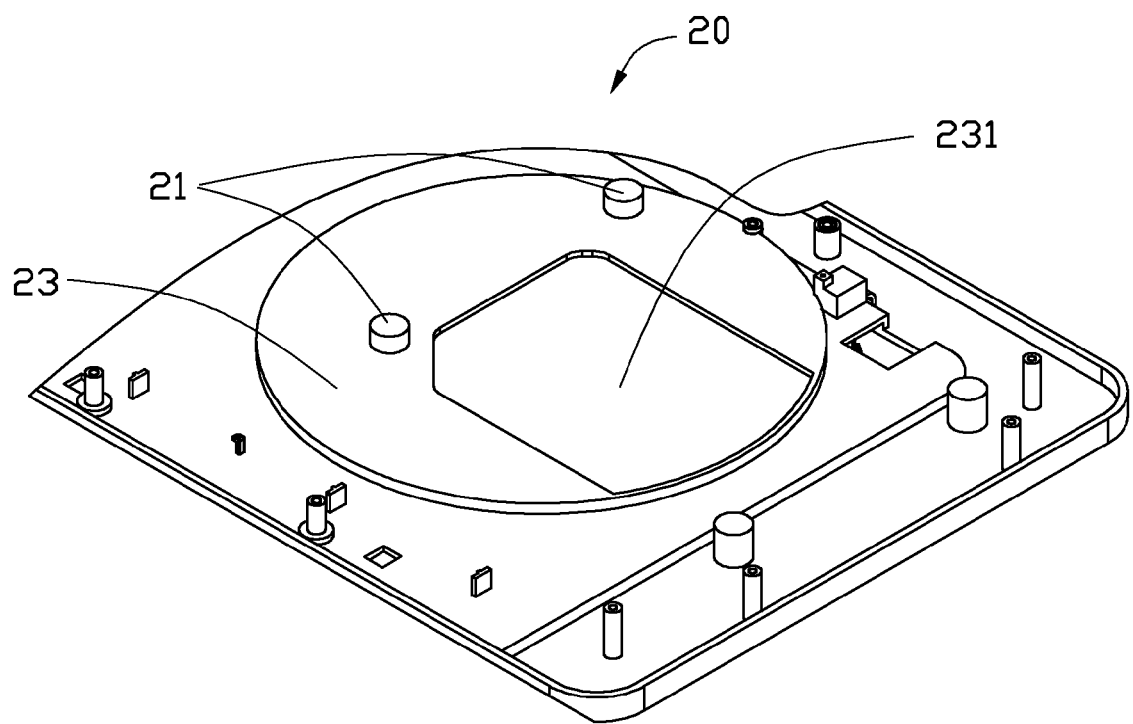
FIG. 3 is an isometric view of a top cover of the portable electronic device of FIG. 2, showing the top cover inverted.
Figure 7:
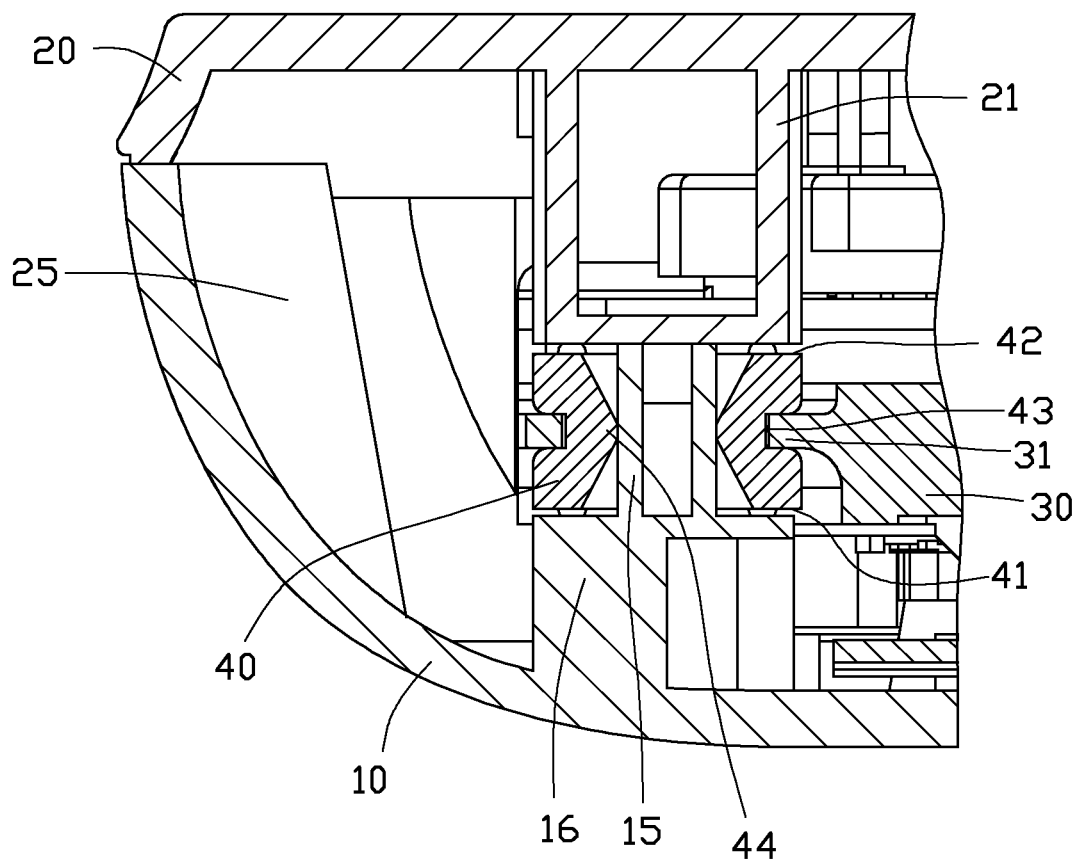
FIG. 7 is an enlarged, cross-sectional view of part of the portable electronic device of FIG. 1, take along line VII-VII thereof.

Referring to FIGS. 1-3 again and to FIG. 7, the top cover 20 is generally rectangular, and edges thereof abut against tops of the sidewalls 14 of the bottom cover 10. A recess 23 is defined in a central portion of the top cover 20, to receive other components, such as optical disk etc, therein. An opening 231 is defined in the top cover 20 at the recess 23, to expose a part of the electronic module 30. A lid 22 is rotatably engaged with the top cover 20 to protect or expose the recess 23 as needed.

A plurality of blocking portions 21 protrudes down from the top cover 20, corresponding to the supporting members 16. Each blocking portion 21 is in the shape of a short cylinder or post. When the portable electronic device 100 is assembled, the blocking portions 21 are aligned with the supporting members 16, respectively. Each of the washers 40 is sandwiched between one blocking portion 21 and the corresponding supporting member 16. In particular, opposite ends of the washer 40 elastically abut against the blocking portion 21 and the supporting member 16.

Figure 5:
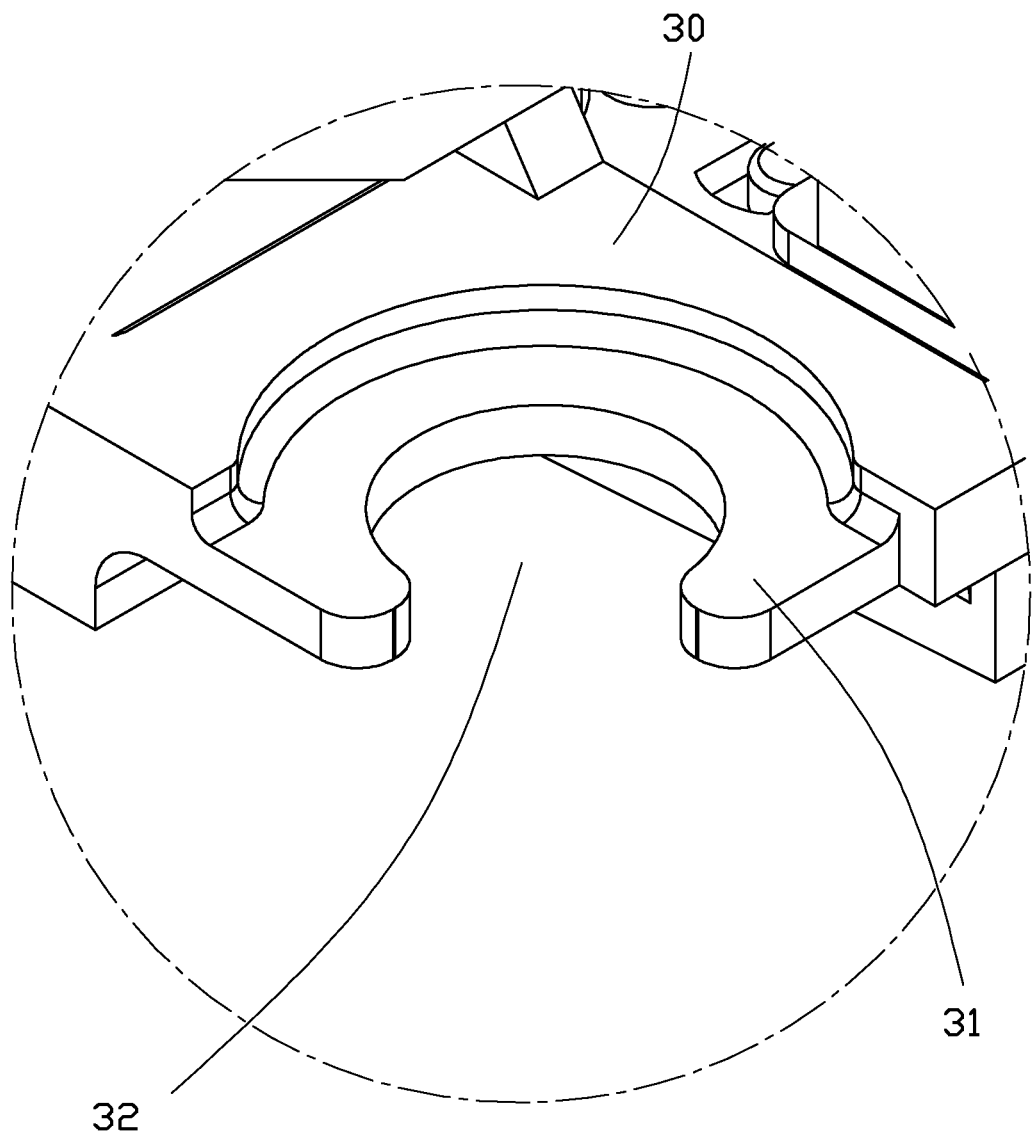
FIG. 5 is an enlarged view of a circled part B of FIG. 2.

Referring to FIG. 2 and FIG. 5, the electronic module 30 is rectangular, and four tabs 31 extend outwardly from four corners thereof. Each of the tabs 31 is approximately a circular plate, and has a cutout 32 defined at an outer side thereof. A plurality of precision electronic components (not shown) is located in the electronic module 30.

Figure 6:
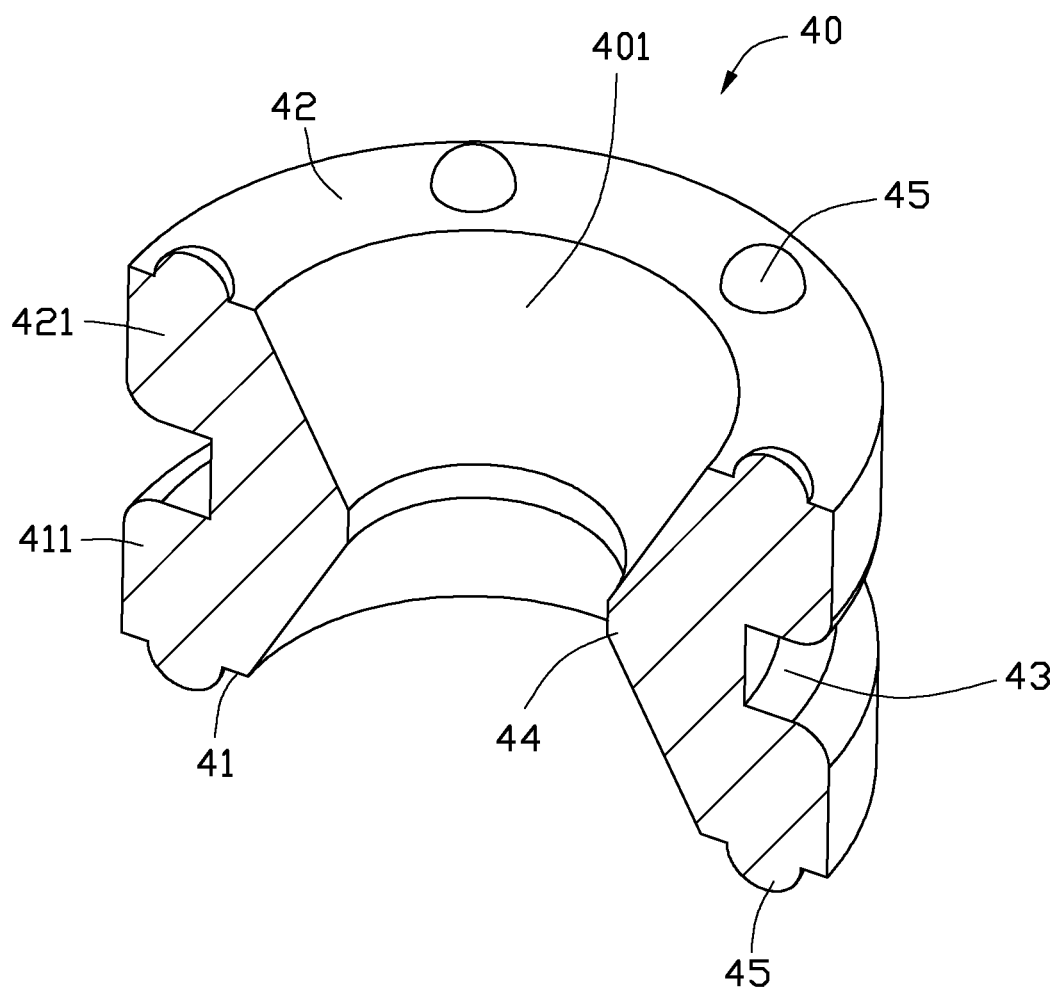
FIG. 6 is an enlarged, cutaway view of a washer of the portable electronic device of FIG. 2.

Referring to FIG. 6, each of the washers 40 is elastic, and is made of plastic or other elastically deformable material. The washer 40 is generally a short, hollow cylinder, and defines a through hole 401 therein from top to bottom. An annular recess 43 is defined in a middle of an outer periphery of the washer 40, along a circumferential direction of the washer 40. A height of the recess 43 is not larger than a thickness of each tab 31 of the electronic module 30. A plurality of protrusions 45 extends outwardly from an annular top surface 42 and an annular bottom surface 41 of the washer 40, respectively. The protrusions 45 are dome-shaped, and are evenly arranged along the top and bottom surfaces 42, 41 of the washer 40.

The washer 40 is divided into a first engaging portion 411 and a second engaging portion 421 by the recess 43. The first engaging portion 411 and the second engaging portion 421 are located at opposite sides of the recess 43. A clasping portion 44 protrudes radially inwards from a middle of an inner periphery of the washer 40. The clasping portion 44 is located between the first and second engaging portions 411, 421, and corresponds to the recess 43. An inner diameter of the washer 40 gradually decreases from each of the top and bottom surfaces 42, 41 to the clasping portion 44.

An outer diameter of the first engaging portion 411 is equal to that of the second engaging portion 421, and is larger than a bore diameter of the cutout 32 of each tab 31. The bore diameter of the cutout 32 is slightly larger than an outer diameter of the clasping portion 44. In other words, the bore diameter of the cutout 32 is slightly larger than an inner diameter of the recess 43.

Referring to FIG. 7 again, when the portable electronic device 100 is assembled, the lid 22 engages with the top cover 20. The top cover 20 engages with the bottom cover 10. The washers 40 are respectively deformed, and inserted into the cutouts 32, with the tabs 31 being engaged in the recesses 43 of the washers 40, respectively. The first engaging portion 411 and the second engaging portion 421 of each washer 40 are located at and abut opposite bottom and top sides of the corresponding tab 31, thereby fixing the washer 40 on the electronic module 30. In a typical embodiment, the first and second engaging portions 411, 421 of each washer 40 elastically clasp the opposite bottom and top sides of the corresponding tab 31.

The blocking portions 21 of the top cover 20 are aligned with the supporting members 16 of the bottom cover 10. The poles 15 of the bottom cover 10 respectively extend through the through holes 401 of the washers 40 and abut bottom ends of the blocking portions 21. In a typical embodiment, the clasping portion 44 of each washer 40 elastically holds the corresponding pole 15, and the poles 15 abut against the bottom ends of the blocking portions 21. The washers 40 are thus sandwiched between the blocking portions 21 and the supporting members 16. The protrusions 45 arranged on the top surface 42 and the bottom surface 41 of each washer 40 respectively elastically abut against the bottom end of the corresponding blocking portion 21 and the top plate 163 of the corresponding supporting member 16. Thus, the electronic module 30 avoids directly contacting the top cover 20 and the bottom cover 10.

In use of the portable electronic device 100, if the top cover 20 and/or the bottom cover 10 is subjected to vibration, transmission of the vibration to the electronic module 30 is buffered by the washers 40. That is, the washers 40 partially or even completely absorb the vibration. Thus, the precision electronic components in the electronic module 30 are safeguarded even though the portable electronic device 100 itself may be subjected to external impact, jarring, shock etc. Accordingly, the stability and reliable performance of the portable electronic device 100 are improved.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A portable electronic device comprising:
a bottom cover, a plurality of poles protruding up from the bottom cover;
a top cover, the top cover engaging with the bottom cover to define a space therebetween;
an electronic module received in the space; and
a plurality of elastic washers fixed on the electronic module, a through hole defined in each of the washers, the poles respectively extending through the through holes of the washers, and opposite top and bottom ends of each of the washers respectively elastically abutting the top cover and the bottom cover;
wherein each of the washers comprises a plurality of protrusions extending from each of the opposite ends thereof, and the protrusions elastically abut the top cover and the bottom cover, respectively.

2. The portable electronic device of claim 1, wherein each of the washers comprises a clasping portion protruding from an inner periphery thereof into the through hole of the washer, and the clasping portion elastically holds the corresponding pole.

3. The portable electronic device of claim 1, wherein an annular recess is defined in an outer periphery of each of the washers, and the electronic module is engaged in the recesses of the washers and held by the washers at opposite top and bottom sides of each of the recesses.

4. The portable electronic device of claim 3, wherein the electronic module comprises a plurality of tabs extending therefrom, and the tabs are received in the recesses of the washers, respectively, and are held by the washers at the opposite top and bottom sides of the recesses.

5. The portable electronic device of claim 4, wherein a cutout is defined at an outer side of each of the tabs, and a middle portion of each of the washers at an inner periphery of the recess is engaged in the cutout of the corresponding tab.

6. The portable electronic device of claim 1, wherein the bottom cover comprises a plurality of supporting members formed thereon, the poles respectively extend up from the supporting members, and the bottom ends of the washers elastically abut the supporting members.

7. The portable electronic device of claim 6, wherein each of the supporting members comprises a top plate and a sidewall interconnecting the top plate and the bottom cover, and the bottom ends of the washers elastically abut the top plates of the supporting members.

8. The portable electronic device of claim 7, wherein each of the poles extends from a middle of the top plate of the corresponding supporting member.

9. The portable electronic device of claim 7, wherein each of the supporting members further comprises a rib substantially surrounded by the sidewall of the supporting member, and opposite ends of the rib interconnect the bottom cover and the top plate of the supporting member.

10. The portable electronic device of claim 6, wherein a plurality of blocking portions extends down from the top cover, and the top ends of the washers elastically abut the blocking portions.

11. The portable electronic device of claim 10, wherein the blocking portions are aligned with the supporting members, and the washers are elastically sandwiched between the blocking portions and the supporting portions.

12. The portable electronic device of claim 11, wherein the poles respectively abut the blocking portions.

13. A portable electronic device comprising:
a bottom cover, a supporting member protruding up from the bottom cover;
a top cover engaging with the bottom cover, a blocking portion protruding down from the top cover towards the supporting member;
an electronic module located between the top cover and the bottom cover; and
an elastic washer attached to the electronic module and sandwiched between the supporting member and the blocking portion, opposite ends of the washer respectively abutting against the supporting member and the blocking portion;
wherein a plurality of protrusions respectively protrudes from the opposite ends of the washer and elastically abuts the supporting portion and the blocking portion.

14. The portable electronic device of claim 13, wherein a cutout is defined in the electronic module, the washer engages in the cutout and elastically clasp the electronic module at an edge of the cutout.

15. The portable electronic device of claim 14, wherein the washer is cylindrical and a recess is defined in an outer periphery of the washer, and the edge of the cutout is received in the recess of the washer.

16. The portable electronic device of claim 13, wherein a through hole is defined in the washer, a pole protrudes from the supporting member, and the pole extends through the through hole of the washer and abuts against the blocking portion.

17. The portable electronic device of claim 16, wherein a clasping portion protrudes from an inner periphery of the through hole of the washer and clasps the pole.

18. A portable electronic device comprising:
   a bottom cover, a plurality of supporting members formed on the bottom cover and a plurality of poles protruding up from the supporting members, each of the supporting members comprising a top plate, a sidewall interconnecting the top plate and the bottom cover, and a rib substantially surrounded by the sidewall of the supporting member, opposite ends of the rib interconnecting the bottom cover and the top plate of the supporting member;
   a top cover, the top cover engaging with the bottom cover to define a space therebetween;
   an electronic module received in the space; and
   a plurality of elastic washers fixed on the electronic module, a through hole defined in each of the washers, the poles respectively extending through the through holes of the washers, and opposite top and bottom ends of each of the washers respectively elastically abutting the top cover and the top plates of the supporting member.

19. The portable electronic device of claim 18, wherein a plurality of blocking portions extends down from the top cover, and the top ends of the washers elastically abut the blocking portions.

20. The portable electronic device of claim 19, wherein the blocking portions are aligned with the supporting members, and the washers are elastically sandwiched between the blocking portions and the supporting portions.

* * * * *